United States Patent

[11] 3,582,860

[72] Inventor Sidney Milovac
Oak Lawn, Ill.

[21] Appl. No. 821,790
[22] Filed May 5, 1969
[45] Patented June 1, 1971

[73] Assignee Selectron International Co., Inc.
Chicago, Ill.

[54] ELECTRICAL CONTROL DEVICE
11 Claims, 6 Drawing Figs.

[52] U.S. Cl. .......... 338/183, 338/202
[51] Int. Cl. .......... H01c 9/02
[50] Field of Search .......... 338/183, 176, 177, 178, 179, 180, 181, 182, 184, 202

[56] References Cited
UNITED STATES PATENTS

| | | | |
|---|---|---|---|
| 2,472,369 | 6/1949 | Davis | 318/325 |
| 2,777,926 | 1/1957 | Bourns | 338/183X |
| 2,980,876 | 4/1961 | Larson | 338/183 |
| 3,431,530 | 3/1969 | Bang | 338/183 |
| 3,465,277 | 9/1969 | Bang | 338/183 |

*Primary Examiner*—Laramie E. Askin
*Assistant Examiner*—D. A. Tone
*Attorneys*—Ronald L. Engel, Daniel W. Vittum, Jr. and Gomer W. Walters

ABSTRACT: Electrical signal control is achieved by a device utilizing uniformly spaced resistive and conductive elements, each of which has one of a pair of electrically connected contacts bearing against it. An actuator is utilized to simultaneously displace the contacts in order to control the characteristics of a signal applied to the device. A gear arrangement provides positive setting. The device may be formed in the shape of a rectangular parallelepiped to permit stacking with a plurality of other such devices.

INVENTOR
SIDNEY MILOVAC
BY Gomer W. Walters
Atty

ELECTRICAL CONTROL DEVICE

BACKGROUND OF THE INVENTION

1. Field of the Invention

This invention relates generally to electrical controls and, more specifically, this invention relates to electrical controls of the rheostatic type utilized in television sets and other electronic circuits.

2. Description of the Prior Art

Variable resistance or voltage control devices are used quite extensively in many electronic circuits to adjust circuit conditions to provide a desired result. This type of adjustment would be very difficult and time consuming if the circuit had to be broken for each change in the resistance, and thus rheostatic controls are virtually a necessity.

In a television set, for example, a variable control is required in order to tune the television circuitry for accurate reproduction of the transmitted audio and video signals. As the components utilized in the circuitry will vary within prescribed tolerances, an adjustable control is required to overcome the effects of these variations and permit accurate tuning of the circuitry. Also, since there are a large number of interrelated circuits in a television set, the manufacturer must be able to vary the voltage at various points in the circuitry in order to obtain the desired reproduction characteristics. This tuning is, of course, carried out by the manufacturer or his service organization, and the variable controls are not normally accessible to the television viewer. Due to the interrelationship between the various portions of the television circuitry, it is necessary to prevent the carefully adjusted settings of the controls from being altered.

The prior art type of control normally used in these environments is a wire-wound resistor formed in a circular pattern and mounted around the periphery of a cylindrical casing. A movable contact engages the wire-wound resistor and is mounted on an arm that it pivotally rotatable above the axis of the cylindrical casing. A control shaft extends along the axis of the casing and outwardly therefrom in order to permit manual setting of the movable contact. These controls are normally mounted on an insulating board with the casing on one side of the board and the control shaft extending through to the other side of the board.

These prior art control devices have a number of disadvantages. One of the disadvantages of this type of control is that the setting of the control device is not ascertainable visually, which results from the circular nature of the device and the fact that the resistive element and movable contact are wholly enclosed within a casing. In many cases, it is desirable to have the control preset to a position that will yield the approximate resistance desired by the party utilizing the control. Of course, the setting will normally have to be adjusted to provide the fine tuning required, for example, in a television set, but having the control preset to a position approximately that ultimately required will frequently be of considerable benefit to the user. Of course, the circular type of prior art control may be preset to some degree by turning the control shaft to move the movable contact to one end of the wire-wound resistor and then rotating the control shaft what one considers to be an appropriate amount to give the approximate setting, but this method is highly inaccurate. In addition to being inaccurate, this type of presetting of the prior art control is quite time consuming, and there is no way to determine if the control has actually been preset.

Another disadvantage of the prior art control devices involves the fact that once the controls have been set to the desired fine tuning position it is necessary to keep the control set at this position in order for the electronic circuit to perform properly. The prior art controls are held in a given setting only by the pressure between the movable contact and the wire-wound resistor. Thus, if the unit is bumped or jostled it may be sufficient to alter the setting of the control and disrupt the fine tuning of the complete circuit.

Additionally, prior art control devices take up much room and each control must be separately mounted, as a result of their cylindrical shape. Therefore, if a particular use requires a large number of controls a space problem is presented and the resulting unit is large and bulky.

SUMMARY OF THE INVENTION

The present invention obviates the difficulties inherent in the prior art controls. Briefly, in the preferred embodiment disclosed herein, the present invention relates to an electrical control device enclosed in a housing. The housing is a rectangular casing that is formed of two separate sections. The first section of the casing has assembly shoulders formed thereon, while the second section has resilient prongs formed thereon to engage the assembly shoulders in the first section. This arrangement greatly facilitates the assembling and disassembling of the control devices. A resistive element, which may be a wire-wound resistor, is located in the first section of the casing, while a conductive element, which may be a flat strip of metal, is located in the second section. Appropriate input and output terminals are connected to the resistive and conductive elements through the bottom of the respective sections. A gear track is formed in the second section at the bottom of the conductive element and is coextensive therewith.

When the two sections of the casing are assembled together, a contactor, such as a pair of contacts interconnected by an electrically conductive spring, extends between the resistive element and the conductive element. An actuating means, in this case an actuating disc, is arranged to simultaneously displace the contacts upon activation thereof. This actuating disc extends through an appropriate opening in the top of the second section of the casing to be manually engaged for setting the control device at a desired position. Since the position of the actuating disc represents the actual placement of the contact elements, it is possible to visually determine the approximate setting of the control. Therefore, the difficulties encountered in presetting the prior art controls are overcome.

To accurately and positively position the actuating disc, a gearwheel or pinion is attached thereto and adapted to engage the gear track in the second section of the casing. The gearwheel is concentrically arranged with the actuating disc so that a cylindrical opening may be formed through the gearwheel and the actuating disc to receive the spring interconnecting the contact elements. Since a contact is attached to each end of the spring, a contact extends from each side of the actuating disc—gearwheel assembly, one of which engages the resistive element while the other engages the conductive element. As a result of the engagement between the gearwheel and the gear track, the actuating disc and the contacts are positively positioned wherever the actuating disc is set. Therefore, any alteration of the setting due to movement or jarring is essentially eliminated.

When the present invention is utilized in a rectangular casing, the flat structure permits stacking of a large number of controls in a small space. To assist in stacking quantities of the controls, aligned grooves may be formed in each end of both sections of the casing. When the casing is assembled by joining the sections, the grooves will form a channel across each end of the casing. A holding device, such as a resilient band, may then be passed through the channels to hold the plurality of control in a unitary mass.

Accordingly, it is a primary object of this invention to provide an electrical control device that may be easily and inexpensively manufactured and assembled.

Another object of this invention is to provide an electrical control device that may be easily and accurately preset to a position approximating a given setting.

Still another object of this invention is to provide an electrical control device in which the setting thereof may be visually determined.

Yet another object of this invention is to provide an electrical control device the setting of which is essentially impervious to movement or jarring of the device.

Another object of this invention is to provide electrical control devices that can be easily grouped together in a relatively small space.

Still a further object of this invention is to provide an electronic control device casing that may be easily assembled and disassembled.

These and other objects, advantages, and features of the present invention will hereinafter appear and, for purposes of illustration, but not of limitation, an exemplary embodiment of the subject invention is illustrated in the attached drawing.

DESCRIPTION OF THE PREFERRED EMBODIMENT

Figures 1, 2, 3, 5, 6:
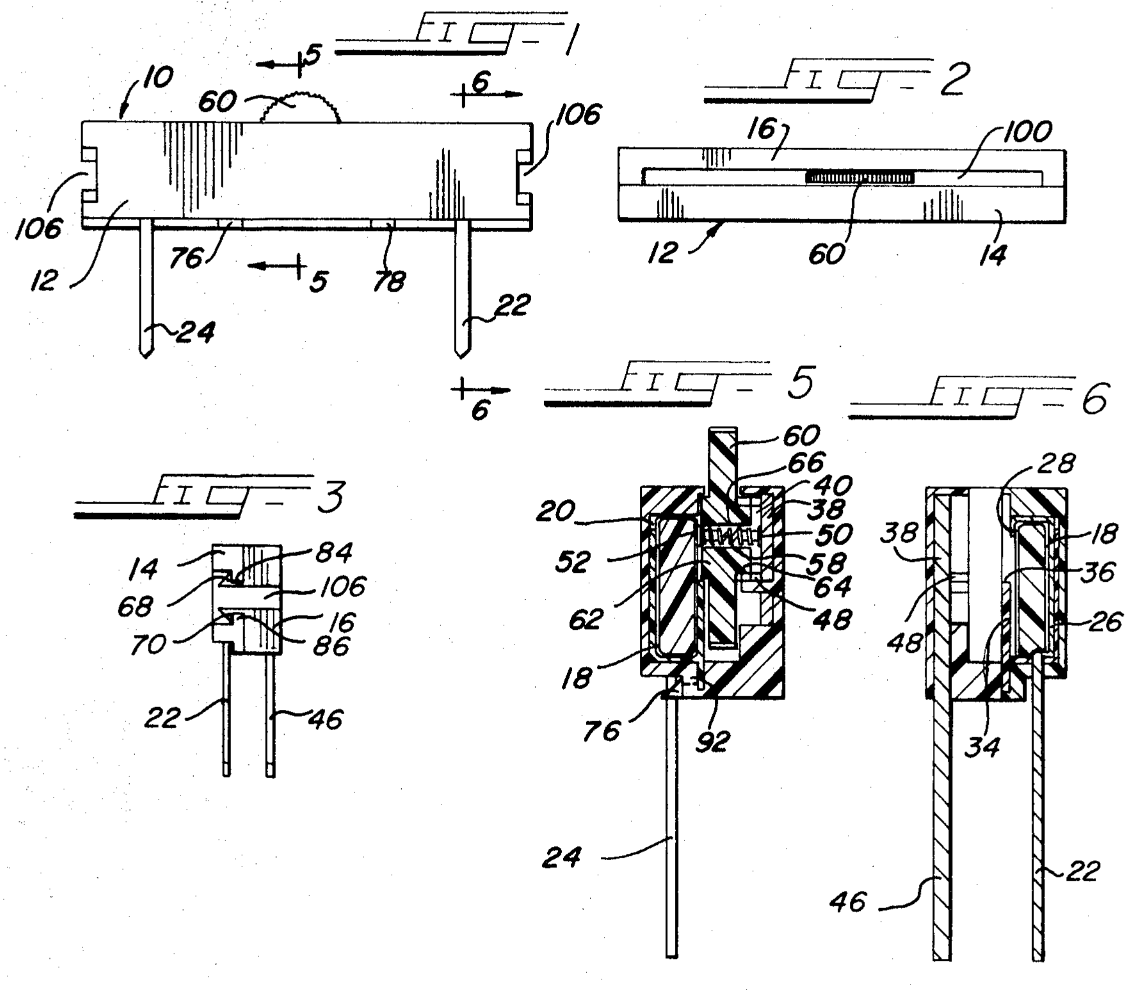
FIG. 1 is a front elevational view of an electrical control device constructed in accordance with the present invention.
FIG. 2 is a top plan view of the electrical control device illustrated in FIG. 1.
FIG. 3 is a right end plan view of the electrical control device illustrated in FIG. 1.
FIG. 5 is an enlarged cross-sectional view taken along line 5–5 of FIG. 1.
FIG. 6 is an enlarged cross-sectional view taken along line 6–6 of FIG. 1.

With respect to FIG. 1 of the drawing, an electrical control device 10 is illustrated. Electrical control device 10 includes an enclosing housing 12, which in this preferred embodiment takes the form of a rectangular casing. It should be realized, though, that certain aspects of the invention could be equally advantageously utilized in a housing other than the rectangular casing of the preferred embodiment described herein.

Figure 4:
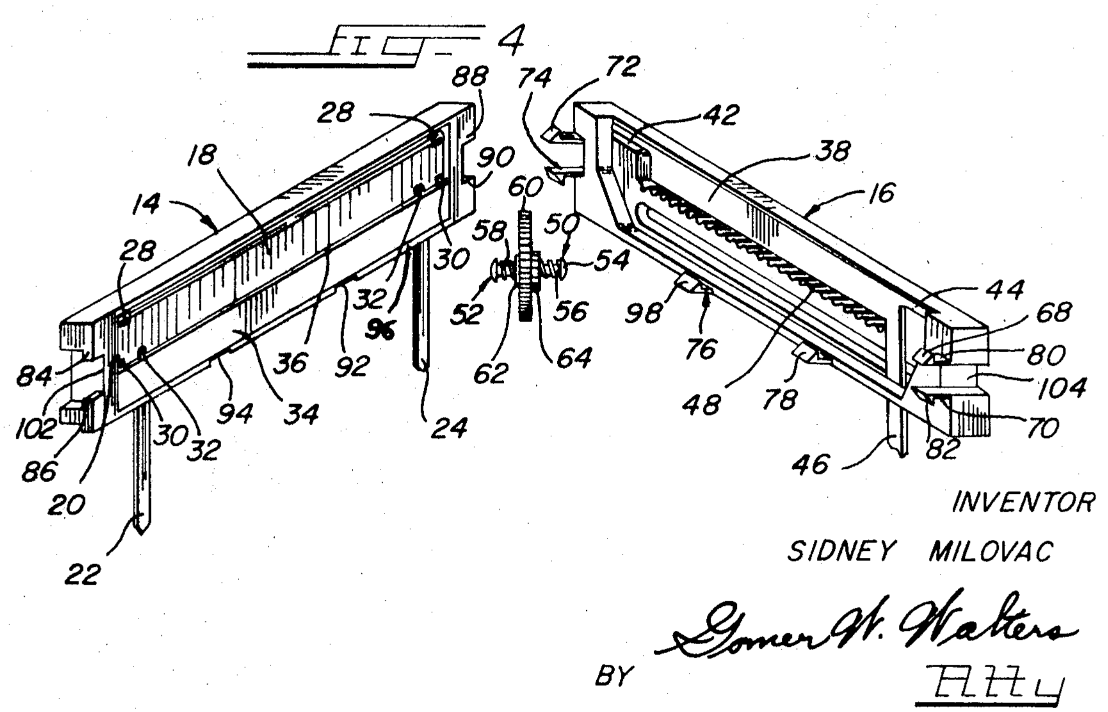
FIG. 4 is an exploded perspective view of the electrical control device illustrated in FIG. 1.

For ease in describing the invention, primary reference will be made to FIG. 4. In that figure, a first section 14 and a second section 16 of rectangular casing 12 are illustrated. The first section 14 has a resistive element 18 mounted therein and extending substantially the entire length thereof. Wire-wound resistor 18 is located in a recess or chamber 20 formed in section 14. This particular resistive element is a wire-wound resistor of the type utilized in rheostats, although it should be recognized that any suitable type of resistive element could be utilized in place of the wire-wound resistor.

A pair of terminals 22 and 24 extend to chamber 20 through the bottom of section 14. Terminals 22 and 24 each terminate in a plate 26 (see FIG. 6) having tabs 28, 30, and 32. Terminals 22 and 24 are molded into section 14 during the fabrication thereof, with tabs 28, 30, and 32 on both terminals extending at right angles to the plane of the terminals. During assembly, the wire-wound resistor 18 is placed between the tabs and the tabs are crimped as illustrated in FIG. 4 to fixedly retain wire-wound resistor 18 in chamber 20.

An insulating block 34 is positioned over the lower portion of chamber 20 and wire-wound resistor 18. The top edge of block 34 forms a ledge or track 36.

A conductive element 38 is located in recess 40 of section 16. Conductive element 38 is a strip of conductive metal having projection ends 42 and 44 and a terminal 46 formed integrally therewith. Of course, conductive element 38 could be any other appropriate type of extended conductor. Conductive element 38 is molded into section 16 during the fabrication thereof, in the same fashion that terminals 22 and 24 are molded into section 14.

A gear track 48 is formed in section 16 at the bottom of conductive element 38 during the manufacture of the section. Gear track 48 is coextensive with conductive element 38 and resistive element 18.

A pair of contacts 50 and 52 are arranged so that contact 50 engages conductive element 38, while contact 52 engages resistive element 18. Each of the contacts 50 and 52 is in the shape of a stud, with a head 54 and a shaft 56. Contacts 50 and 52 are interconnected by an electrically conductive spring 58 which encircles and is affixed to the shaft 56 of each of the contacts.

An actuating disc 60 is arranged to simultaneously displace contacts 50 and 52 through out the length of control device 10. A small disc or roller 62 is formed integrally and concentrically with actuating disc 60 on the side thereof toward section 14. Roller 62 is adapted to roll on ledge 36 of block 34 in section 14 when the device is assembled. A gear wheel or pinion 64 is located concentrically with disc 60 on the side thereof toward section 16. Gearwheel 64 may be attached to actuating disc 60 in any suitable manner, but in this preferred embodiment gear wheel 64 is formed integrally with actuating disc 60. Gearwheel 64 is adapted to engage gear track 48 when the control device 10 is assembled.

In order to have actuating disc 60 control the displacement of contacts 50 and 52, a cylindrical opening is formed through actuating disc 60, roller 62 and gearwheel 64. Spring 58 is passed through opening 66 and has contact 50 attached to and projecting from one end thereof and contact 52 attached to and projecting from the other end thereof. Thus, contacts 50 and 52 are biased against conductive element 38 and resistive element 18, respectively, and as actuating disc 60 is rotated, contacts 50 and 52 are simultaneously displaced along their respective elements.

Section 16 of casing 12 has resilient assembly prongs 68, 70, 72, 74, 76, and 78 formed thereon. Each of the prongs has an extended arm 80 and a head portion 82. In this preferred embodiment, these prongs are formed integrally with section 16 and of the same material thereas.

Each of the assembly prongs 68, 70, 72, 74, 76, and 78 is adapted to engage a corresponding assembly shoulder 84, 86, 88, 90, 92, and 94 formed on section 14. Shoulders 84, 86, 88, and 90 are formed in the ends of section 14, while shoulders 92 and 94 are formed from a projection 96 located at the bottom of section 14 of casing 12.

When sections 14 and 16 are pressed or forced toward each other, resilient prongs 68, 70, 72, 74, 76, and 78 are bent by the interaction between ramps 98 formed on the heads thereof and the corresponding shoulders in section 14. When sections 14 and 16 come together, the prongs spring back to their original positions to engage the corresponding shoulders with the hooked portions thereof and thus complete assembly of the device. The end view of FIG. 3 illustrates the assembled engagement between prongs 68 and 70 and the corresponding shoulders 84 and 86, respectively. Similarily, FIG. 5 illustrates the assembled engagement of prong 76 with shoulder 92. Due to the engagement of the hooked prongs with the shoulders, the control device is securely and firmly assembled. However, the device may then be easily disassembled by merely pressing the prongs 68 and 70 (and prongs 72 and 74) toward each other to disengage them from the corresponding shoulders. Prongs 76 and 78 may then be slid over shoulders 92 and 94 by pivoting section 16 downwardly about an axis extending through the engagement of prongs 76 and 78 with shoulders 92 and 94.

As may be seen from the top view of FIG. 2, the indented or recessed portion of section 16 results in a opening 100 being formed in the casing 12. Opening 100 is wide enough to permit actuating disc 60 to extend therethrough. As may be seen in FIG. 1, actuating disc 60 extends above the top of the casing 12 so that contacts 50 and 52 may be displaced by manual activation of actuating disc 60.

When the device is assembled, an electrical signal may be applied to terminals 22 and 24. This signal could be, of course, either an information bearing signal or a DC control voltage. Depending upon the positioning of contact 52 along the length of resistor 18, the signal transmitted through spring 58, contact 50, and conductive element 38 to terminal 46 will be an altered version of the signal applied to terminals 22 and 24. Of course, device 10 could also be used as a variable resistor by using only one of the terminals 22 or 24.

Due to the flatness of this particular preferred embodiment, these electrical control devices may be relatively easily grouped or stacked. When the units are stacked, however, it is desireable to have some way in which to maintain the devices in a fixed group (i.e., a given relative orientation). To permit such a fixed grouping, applicant has formed a groove 102 at each end of section 14 and a groove 104 at each end of section 16. When the devices are assembled, the grooves 102 in section 14 align with the grooves 104 in section 16 to form a channel 106 that extends across the width of each end of control device 10. To maintain a plurality of control devices in a fixed relative position with respect to each other, a binding such as a flexible band may be passed through channels 106 of the devices. Such an arrangement also permits the simple addition, subtraction, or substitution of control devices in a stack or group.

It should be understood that the embodiment described is merely exemplary of the preferred practice of the present invention and that various changes, modifications, and variations may be made in the details of construction, arrangement, and operation of the elements disclosed herein, without departing from the spirit and scope of the present invention.

I claim:

1. An electrical control device comprising:
a housing;
an extended conductive element located in said housing;
a first terminal electrically connected to said conductive element;
a resistive element located in said housing, said resistive element coextending with said conductive element at a substantially uniform spacing therefrom;
a second terminal electrically connected to said resistive element;
a first contact resiliently biased against said conductive element;
a second contact resiliently biased against said resistive element;
conducting means electrically interconnecting said first and second contact elements;
actuating means for displacing said first and second contact elements;
a gear track located in said housing and coextending with said conductive element and said resistive element; and
gear means on said actuating means retaining said conducting means and adapted to engage said gear track,
whereby the characteristics of an electrical signal applied to said first terminal or to said second terminal and taken from the other of said terminals may be altered by displacement of said contacts by said actuating means, said contacts being fixedly stationed in the positions to which they are displaced.

2. An electrical control device as claimed in claim 1 and further comprising a third terminal electrically connected to said resistive element at a point spaced from said second terminal,
whereby the characteristics of an electrical signal applied between said second terminal and said third terminal and taken from said first terminal may be altered by displacement of said contacts by said actuating means.

3. An electrical control device as claimed in claim 1 wherein:
said actuating means comprises an actuating disc; and
said gear means comprises a gearwheel attached to said actuating disc.

4. An electrical control device as claimed in claim 3 wherein said conducting means comprises a coil spring passing through said actuating disc and said gearwheel with said first contact mounted on one end thereof and said second contact mounted on the other end thereof.

5. An electrical control device as claimed in claim 1 wherein said resistive element comprises a wire-wound resistor.

6. An electrical control device as claimed in claim 1 wherein:
said housing is a rectangular casing;
said conductive element is a straight rectangular strip of conductive material located along one side of said rectangular casing; and
said resistive element is a straight wire-wound resistor located along the opposite side of said rectangular casing.

7. A linear electrical control device comprising;
a rectangular casing;
a conductive element located along one side of said rectangular casing;
a first terminal electrically connected to said conductive element and extending from said casing;
a resistive element located along the side of said casing opposite said conductive element;
a second terminal electrically connected to said resistive element adjacent one end thereof and extending from said casing;
a third terminal electrically connected to said resistive element adjacent the other end thereof and extending from said casing;
a contactor extending between and electrically contacting said conductive element and said resistive element;
a actuating disc for displacing said contactor;
a gear track located adjacent said conductive element and said resistive element and coextensive therewith; and
a gearwheel attached to said actuating disc and adapted to engage said gear track, a common axial cylindrical opening formed through said actuating disc and said gearwheel with said contactor passing through said cylindrical opening,
whereby the electrical signal obtained from said first terminal is the signal applied between said second and third terminals with the characteristics thereof altered according to the displacement of said contactor by said actuating means.

8. A linear electrical control device as claimed in claim 7 wherein said contactor comprises a pair of contact elements connected by an electrically conductive spring.

9. A linear electrical control device as claimed in claim 7 wherein said rectangular casing comprises:
a first section in which said resistive element is mounted, said first section having assembly shoulders formed on each end and the bottom thereof;
a second section in which said conductive element is mounted, said second section having assembly prongs adapted to engage said assembly shoulders in said first section,
whereby said rectangular casing may be assembled by merely pressing said first and second sections together.

10. A linear electrical control device as claimed in claim 9 and further comprising aligned grooves formed in the ends of said first and second sections to provide a channel across both ends of the assembled control device,
whereby multiple control devices may be stacked and held together by a restraining band passed through said channels on the ends of the control devices.

11. A linear electrical control device as claimed in claim 9 wherein:
a gear track is mounted adjacent and coextensive with said conductive element in said second section;
said actuating means comprises an actuating disc;
a gearwheel is attached to said actuating disc and is adapted to engage said gear track; and
said second section has an opening formed in the top thereof in order for said actuating disc to extend therethrough for activation.